US008615063B2

(12) United States Patent
Lin et al.

(10) Patent No.: US 8,615,063 B2
(45) Date of Patent: Dec. 24, 2013

(54) LEVEL TRANSITION DETERMINATION CIRCUIT AND METHOD FOR USING THE SAME

(75) Inventors: Jung Mao Lin, Taichung (TW); Ching Yuan Yang, Taichung (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 145 days.

(21) Appl. No.: 13/191,983

(22) Filed: Jul. 27, 2011

(65) Prior Publication Data

US 2012/0163794 A1 Jun. 28, 2012

(30) Foreign Application Priority Data

Dec. 23, 2010 (TW) ................................ 99145426 A

(51) Int. Cl.
*H04L 7/00* (2006.01)
(52) U.S. Cl.
USPC ........... 375/355; 375/371; 375/354; 375/343; 398/38; 398/26; 398/9
(58) Field of Classification Search
USPC ........... 375/371, 355, 354, 343; 398/38, 26, 9
See application file for complete search history.

(56) References Cited

U.S. PATENT DOCUMENTS

| 5,642,362 | A  | * | 6/1997  | Savir ............................. 714/726 |
| 6,959,058 | B2 | * | 10/2005 | Yoo et al. ....................... 375/355 |
| 7,069,481 | B2 |   | 6/2006  | Lee et al. |
| 7,242,735 | B2 |   | 7/2007  | Lu et al. |
| 7,340,655 | B2 |   | 3/2008  | Sugita |
| 7,613,254 | B2 |   | 11/2009 | Moriizumi |
| 2005/0135527 | A1 | * | 6/2005 | Masui et al. .................. 375/355 |
| 2006/0115020 | A1 |   | 6/2006 | Yeh et al. |
| 2007/0009066 | A1 | * | 1/2007 | Fredriksson .................. 375/326 |
| 2008/0187080 | A1 | * | 8/2008 | Lee et al. ....................... 375/355 |
| 2009/0279886 | A1 | * | 11/2009 | Suvakovic ...................... 398/26 |
| 2010/0054383 | A1 |   | 3/2010 | Mobin et al. |
| 2010/0142610 | A1 | * | 6/2010 | Stojanovic et al. ........... 375/232 |

FOREIGN PATENT DOCUMENTS

TW        I243537 B        11/2005

OTHER PUBLICATIONS

Chih-Kong Ken Yang et al., "A 0.5-um CMOS 4.0-Gbit/s Serial Link Transceiver with Data Recovery Using Oversampling," IEEE Journal of Solid-State Circuits, vol. 33, No. 5, pp. 713-722, May 1998.
Nathan Kiddinapillai et al., "A 2-5 Gb/s Fully Differential 3X Oversampling CDR for High-Speed Serial Data Link," Downloaded on Mar. 17, 2010 at 04:08:50 EDT from IEEE Xplore.

(Continued)

*Primary Examiner* — Sam K Ahn
*Assistant Examiner* — Fabricio R Murillo Garcia
(74) *Attorney, Agent, or Firm* — Egbert Law Offices, PLLC

(57) ABSTRACT

A level transition determination circuit includes a multi-phase clock generator, an oversampling unit, and a state detection circuit. The multi-phase clock generator is used for receiving an input clock signal and generating S×N clock signals, in which S and N are integers. Each clock signal is synchronized to the input clock signal and has a different delay time. The oversampling unit is used for performing N-times oversampling on M bit periods of the serial input data according to the clock signals, so as to generate M×N sampled values in parallel during the M bit periods. The state detection circuit is used for receiving (M×N)+1 sampled values and generating N detection signals by detecting level transitions between adjacent sampled values of the (M×N)+1 sampled values and the level transition results.

14 Claims, 10 Drawing Sheets

(56) References Cited

OTHER PUBLICATIONS

Zhiwei Mao et al., "A 4Gb/s CMOS Fully-Differential Analog Dual Delaylocked Loop Clock/Data Recovery Circuit," ICECS-2003, pp. 559-562.

Tatsuya Saito et al., "A 50-mWkh 2.5-GbMch Data Recovery Circuit for the SFI-S Interface Using Novel Eye-tracking Method," 2003 Symposium on VLSI Circuits Digest of Technical Papers, pp. 57-60.

W Redman-White et al., "A Robust 1.5Gb/s + 3Gb/s Serial PHY with Feed-Forward Correction Clock and Data Recovery," 2008 IEEE., pp. 170-173.

Office Action issued from the Intellectual Property Office of Taiwan (TIPO) on Jul. 19, 2013.

English translation of Office Action issued from the Intellectual Property Office of Taiwan (TIPO) on Jul. 19, 2013.

* cited by examiner

LEVEL TRANSITION DETERMINATION CIRCUIT AND METHOD FOR USING THE SAME

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present invention relates to a level transition determination circuit and a method for using the same.

2. Description of Related Art Including Information Disclosed Under 37 CFR 1.97 and 37 CFR 1.98

With the rapid development of broadband applications, such as, high definition video programs, online learning, video conferencing and chatting, and cloud computing, users have ever increasing requirements on the bandwidth. Optical networks have become a mainstream technique in the broadband application due to a stable transmission quality with high bandwidth and high speed. Currently, a Passive Optical Network (PON) technique is mostly applied in the industry, in which an Optical Distribution Network (ODN) is used to split an optical signal into multiple paths (most commonly, 16 paths or 32 paths) to be sent to clients, thereby reducing the use of fibers.

The PON has a Point to Multi-Point (PMP) topology architecture, and uploaded data may be converged at the same fiber by the ODN. Therefore, the uploaded data should be transferred in a Time Division Multiplexing (TDM) manner according to a communication protocol, such as IEEE 802.3ah standard or ITU G.983/G.984 standard. The TDM technique refers to dividing a signal channel with time, so as to divide the signal channel into a plurality of time slots, only one user can transfer or receive data in each time slot, and therefore, the time for each user to transfer the data is greatly reduced. In this case, if a conventional data recovery circuit is used to perform recovery, time spent for locking and recovery is too long, which results in waste of bandwidth utilization efficiency. Therefore, for the burst data transmission action, an optical network terminal (ONT) must be provided with a burst-mode receiver to rapidly recover the clock and phase of received data, so as to utilize the bandwidth more effectively.

FIG. 1 is a schematic block diagram of a conventional data recovery circuit based on a phase locked loop (PLL). The data recovery circuit 10 includes a phase/frequency detector 12, a loop filter 14, and a voltage controlled oscillator (VCO) 16. The phase/frequency detector is used for comparing a phase of input data Data_in and a phase of output data Clk_out generated by the VCO 16 to determine whether a phase difference exists therebetween. When the phase difference exists ($\Delta\theta \neq 0$), the phase/frequency detector 12 outputs a phase difference signal PD. The loop filter 14 receives the phase difference signal PD to adjust a level of an output signal Vcont, so as to change the frequency of the VCO 16, until the phase is calibrated. At this point, the data recovery circuit 10 reaches a locked stable state.

If it is intended to design a data recovery circuit having rapid locking characteristic, adopting an oversampling technique may be a feasible method. The oversampling technique is adopted to perform oversampling on received serial input data, so as to obtain edge information of data bits. FIG. 2 is a schematic view of a conventional three-times oversampling technique. When performing the three-times oversampling, a clock frequency of three times a bit data rate is used to perform sampling on bit data in the serial input data. Then, by using sampled data states, an Exclusive-OR (XOR) operation is performed on two adjacent states, and bit edge information of the serial input data is obtained through computation with a group of digital circuits.

After obtaining the bit edge information, a sampling result that is farthest away from the data edge is selected from the three sampling results to serve as the valid data bit. By using the above method, the valid data bit may be obtained after computing several groups of bit edge information, in which a feedback mechanism needs not to be included, and thus the method is applicable to applications requiring rapid locking.

However, in high-frequency circuit application, if it intends to generate sampling clock of high multiple oversampling, the difficulty thereof is increased as well, and therefore, a concept of processing serial input data by a plurality of groups of digital circuits in parallel is introduced, which is a solution for the frequency bottleneck. Therefore, an improved level transition determination circuit for serial input data and a method for using the same are provided, so as to determine level transition points of the serial input data correctly, thereby obtaining a valid data bit.

BRIEF SUMMARY OF THE INVENTION

In an embodiment of the present disclosure, a level transition determination circuit is provided, which includes a multi-phase clock generator, an oversampling unit, and a state detection circuit. The multi-phase clock generator is used for receiving an input clock signal and generating S×N clock signals, in which S and N are integers. Each clock signal is synchronized to the input clock signal and has a different delay time. The oversampling unit is used for performing N-times oversampling on M bit periods of the serial input data according to the clock signals, so as to generate M×N sampled values in parallel during the M bit periods. The state detection circuit is used for receiving (M×N)+1 sampled values, and generates N detection signals by detecting level transitions between adjacent sampled values in the (M×N)+1 sampled values and the level transition results.

In another embodiment of the present disclosure, a level transition determination method is provided, which includes: receiving an input clock signal and generating S×N clock signals, in which each clock signal is synchronized to the input clock signal and has a different delay time, and M and N are integers; performing N-times oversampling on M bit periods of the serial input data according to the clock signals so as to generate M×N sampled values in parallel during the M bit periods; and receiving (M×N)+1 sampled values, and generating N detection signals by detecting level transitions between adjacent sampled values in the (M×N)+1 sampled values and the level transition results.

DETAILED DESCRIPTION OF THE INVENTION

Exemplary Embodiments will now be described more fully with reference to the accompanying drawings. The embodiments may, however, be embodied in many different forms and should not be construed as limited to the embodiments set forth herein. Rather, these embodiments are provided so that this disclosure will be thorough and complete, and will fully convey the scope of the embodiments to those skilled in the art.

Figure 1:
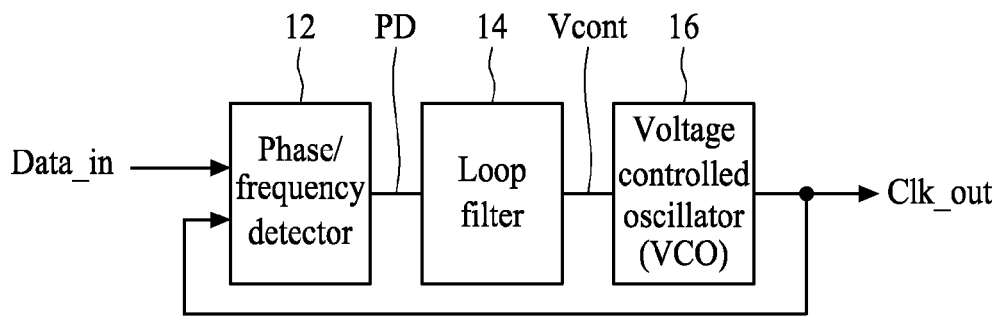
FIG. 1 is a schematic block diagram of a conventional data recovery circuit based on a PLL.
Figure 1:
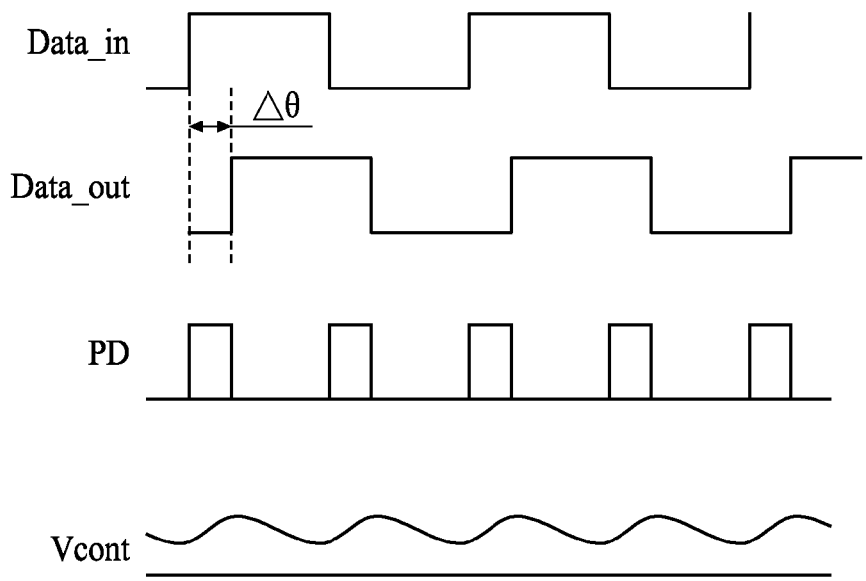
Figure 2:
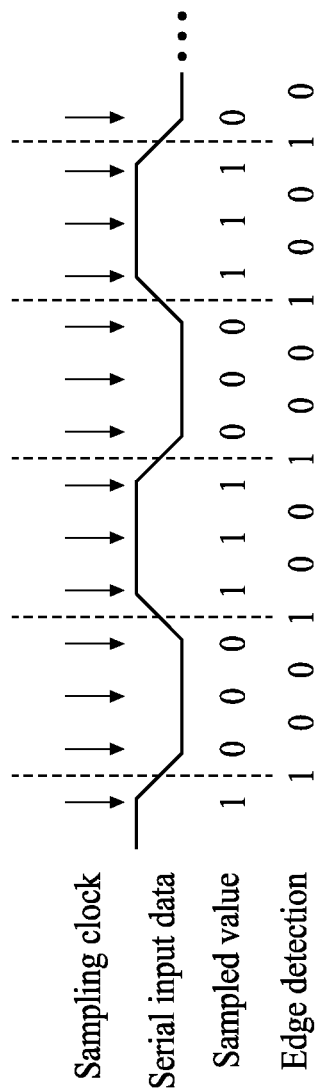
FIG. 2 is a schematic view of a conventional three-times oversampling technique.
Figure 3:
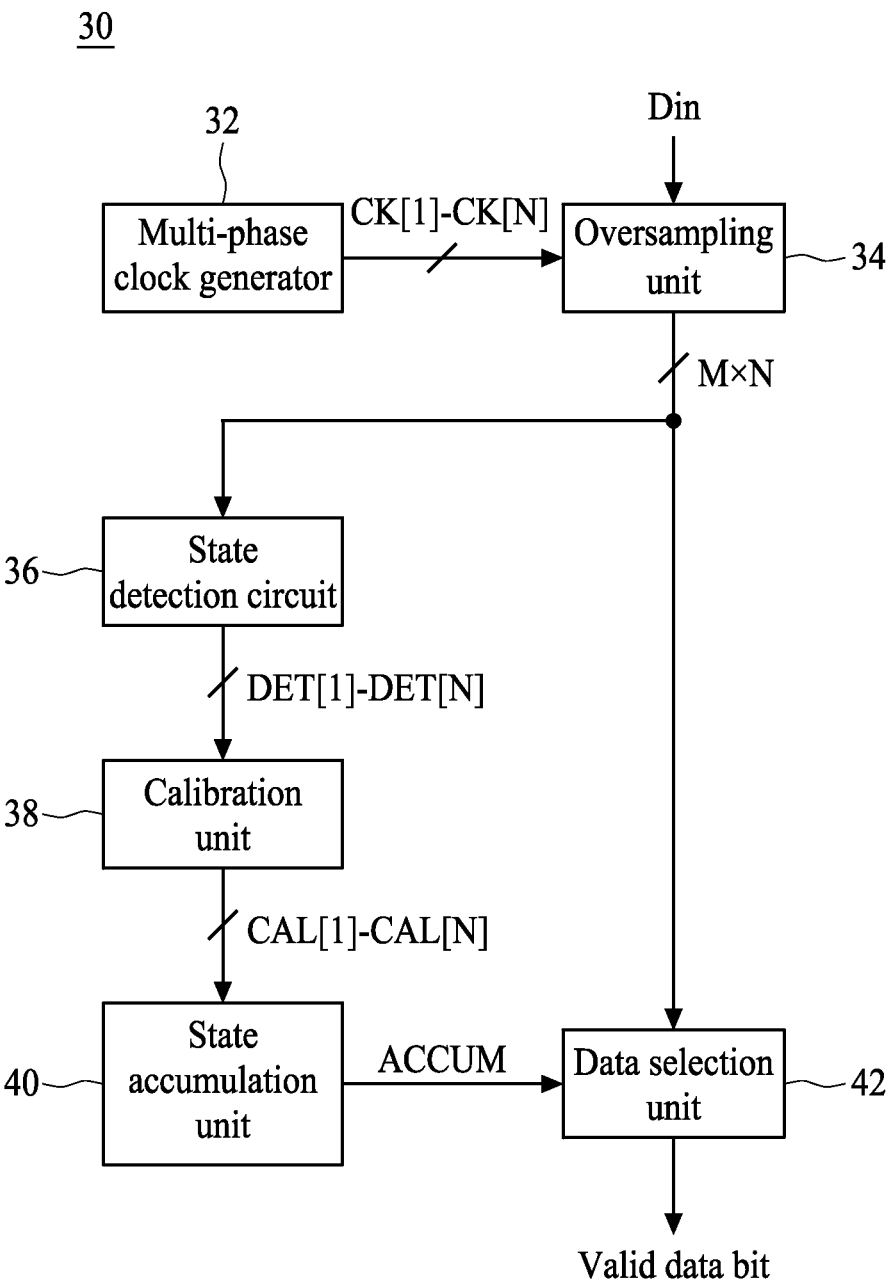
FIG. 3 is a schematic block diagram of a level transition determination circuit for serial input data according to an embodiment.

FIG. 3 is a schematic block diagram of a level transition determination circuit 30 for serial input data according to an embodiment of the present disclosure. The level transition determination circuit 30 is constructed to reduce errors generated due to clock skew or jitter, so as to determine level transition points of the serial input data more correctly and more effectively. The level transition determination circuit 30 is applicable to a front-end circuit of any communication network, for example, a burst-mode receiver of a PON, for recovering data. Referring to FIG. 3, the level transition determination circuit 30 includes a multi-phase clock generator 32, an oversampling unit 34, and a state detection circuit 36. The multi-phase clock generator 32 receives an input clock signal CLK and generates a plurality of clock signals CK[1]-CK[S×N], in which each clock signal is synchronized to the input clock signal CLK and has a different delay time, wherein S is an integer, N represents number of oversampling points. The oversampling unit 34 performs N-times oversampling on M bit periods of a serial input data Din according to the clock signals CK[1]-CK[S×N], so as to generate M×N sampled values in parallel during the M bit periods, in which M and N are integers. The state detection circuit 36 receives (M×N)+1 sampled values, and generates N detection signals DET[1]-DET[N] by detecting level transitions between adjacent sampled values in the (M×N)+1 sampled values and the level transition results.

Referring to FIG. 3, the multi-phase clock generator 32 is designed to generate a plurality of clock signals CK[1]-CK [S×N], and each clock signal is synchronized to the input clock signal CLK and has a different delay time. In an embodiment, the clock signals CK[1]-CK[16] have 16 different delay times, and the phase of each clock signal and the phase of a previous clock signal have a phase difference of 22.5°. The clock signals CK[1]-CK[16] are applied to the oversampling unit 34 in parallel to serve as sampling clock signals of the serial input data Din.

Figure 4:
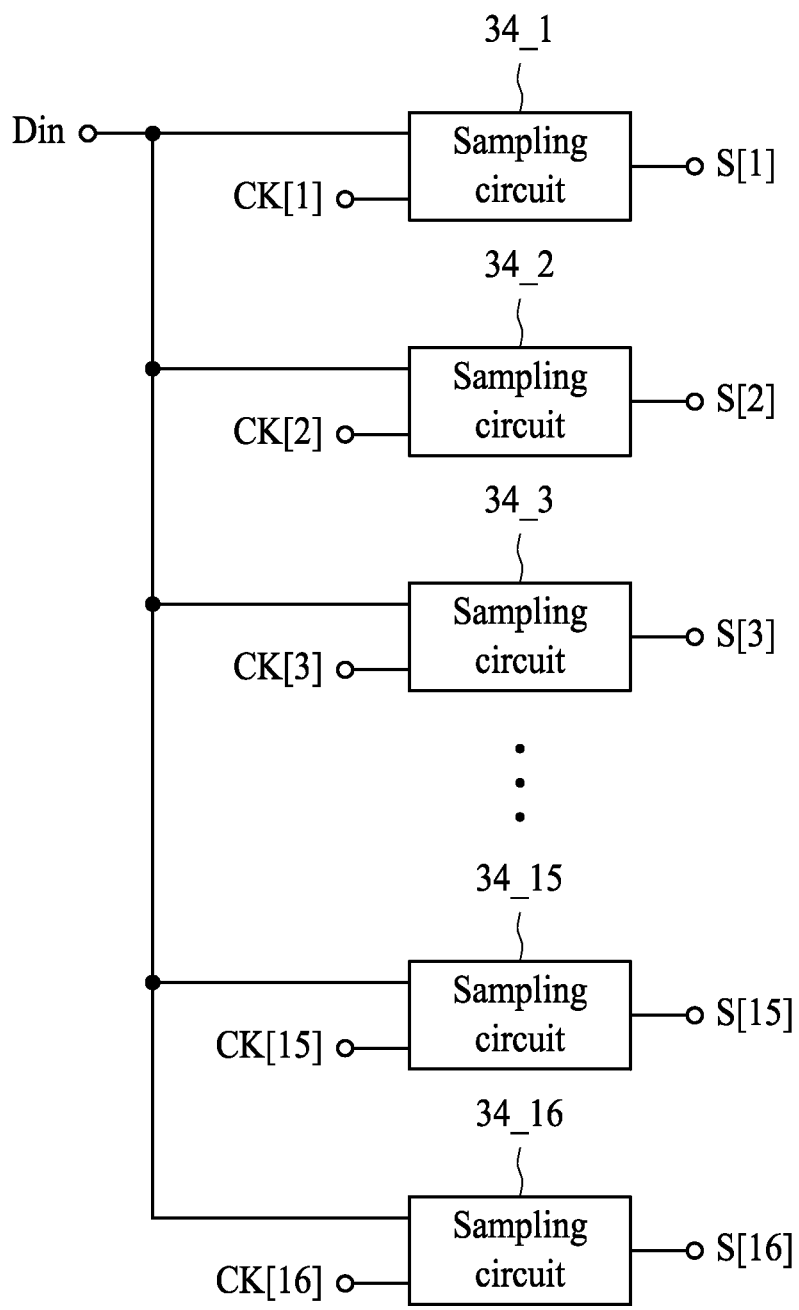
FIG. 4 is a schematic circuit diagram of an oversampling unit according to an embodiment.
Figure 5:
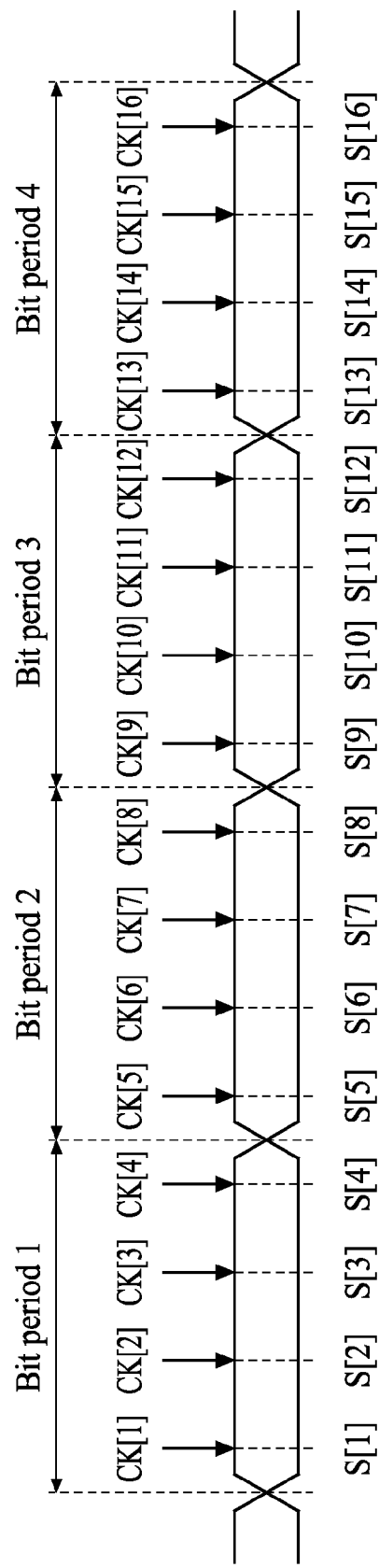
FIG. 5 shows an operation manner of an oversampling unit according to an embodiment.

The oversampling unit 34 performs N-times oversampling on the input data Din, which is input in a serial manner from an external signal source, according to the clock signals CK[1]-CK[S×N], so as to generate oversampling results in parallel. FIG. 4 is a schematic circuit diagram of the oversampling unit 34 according to an embodiment, and FIG. 5 shows an operation manner of the oversampling unit 34 according to an embodiment. In this embodiment, the serial input data Din is composed of repetitive "0" and "1" bits. For simplifying the illustration, the serial input data Din is represented by 4 bit periods in FIG. 5, and sampling clock signals for performing the oversampling are represented by arrows. Referring to FIG. 5, the oversampling unit 34 performs four-times oversampling on the 4 bit periods of the input data Din, and outputs sampling results S[1]-S[16] in parallel. In order to generate the sampling results S[1]-S[16], the oversampling unit 34 includes 16 sampling circuits 34_1-34_16, as shown in FIG. 4. Each sampling circuit receives the serial input data Din, performs sampling according to one of the clock signals CK[1]-CK[16], and outputs a sampled value of the input data Din. Moreover, for performing a subsequent logic operation, in addition to the sampled values S[1] to S[16], the state detection circuit 36 further receives a sampled value S[0]. In an embodiment, the sampled values S[0] is a sampling result obtained by the oversampling unit 34 by sampling a previous bit period of the serial input data Din according to the clock signal CK[16].

Figure 6:
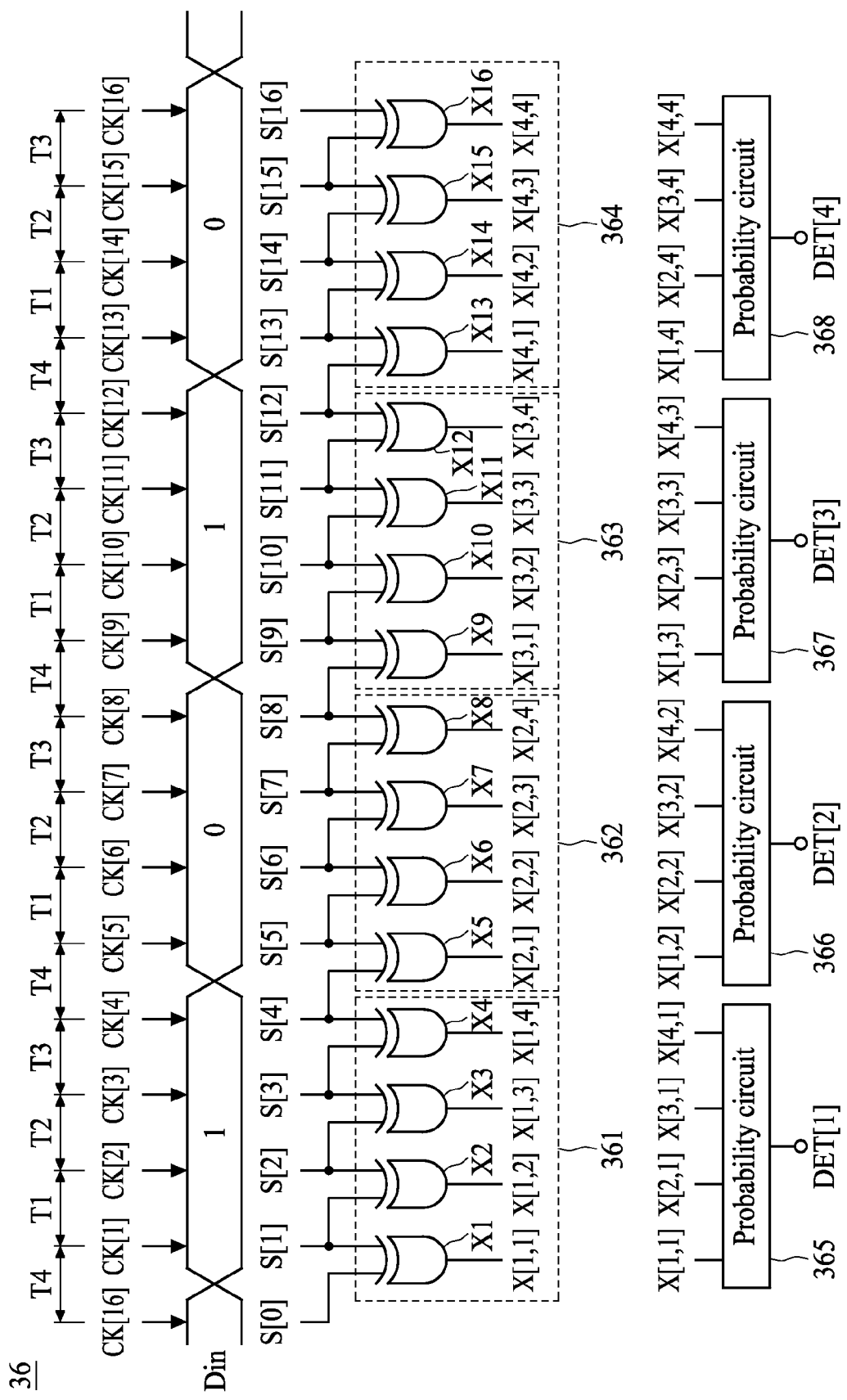
FIG. 6 is a schematic block diagram of a state detection circuit according to an embodiment.

After receiving the sampled values S[0]-S[17], the state detection circuit 36 operates to generate 16 detection signals DET[1]-DET[16]. FIG. 6 is a schematic block diagram of the state detection circuit 36 according to an embodiment. The state detection circuit 36 includes a plurality of logic circuits 361-364 and a plurality of probability circuits 365-368. Referring to FIG. 6, each logic circuit is composed of four Exclusive-OR (XOR) circuits, and each XOR circuit is used for performing an XOR operation on adjacent sampled values in the input data Din to generate a logic signal. For example, after receiving the sampled values S[0]-S[4], the logic circuit 361 performs XOR operations on adjacent sampled values S[0] and S[1], S[1] and S[2], S[2] and S[3], and S[3] and S[4] through the XOR circuits X1-X4, so as to generate logic signals X[1,1], X[1,2], X[1,3] and X[1,4] respectively. The logic signals indicate whether a level change exists between the adjacent sampled values. If the logic signals are at high logic levels, it indicates that the corresponding sampled values are located at a bit edge of the input data Din. Similarly, the logic circuit 362 receives the sampled values S[4]-S[8] and generates logic signals X[2,1]-X[2,4], the logic circuit 363 receives the sampled values S[8]-S[12] and generates logic signals X[3,1]-X[3,4], and the logic circuit 364 receives the sampled values S[12]-S[16] and generates logic signals X[4,1]-X[4,4].

Thereafter, the probability circuit 365 receives the logic signals X[1,1], X[2,1], X[3,1], and X[4,1], and generates a detection signal DET[1], in which the logic signals X[1,1], X[2,1], X[3,1], and X[4,1] are spaced from each other by a fixed time interval T4+T1+T2+T3. The probability circuit 366 receives the logic signals X[1,2], X[2,2], X[3,2], and X[4,2], and generates a detection signal DET[2], in which the logic signals X[1,2], X[2,2], X[3,2], and X[4,2] are spaced from each other by a fixed time interval T1+T2+T3+T4. The probability circuit 367 receives the logic signals X[1,3], X[2,3], X[3,3], and X[4,3], and generates a detection signal DET[3], in which the logic signals X[1,3], X[2,1], X[3,3], and X[4,3] are spaced from each other by a fixed time interval T2+T3+T4+T1. The probability circuit 368 receives the logic signals X[1,4], X[2,4], X[3,4], and X[4,4], and generates a detection signal DET[4], in which the logic signals X[1,4], X[2,4], X[3,4] and, X[4,4] are spaced from each other by a fixed time interval T3+T4+T1+T2.

Figure 7:
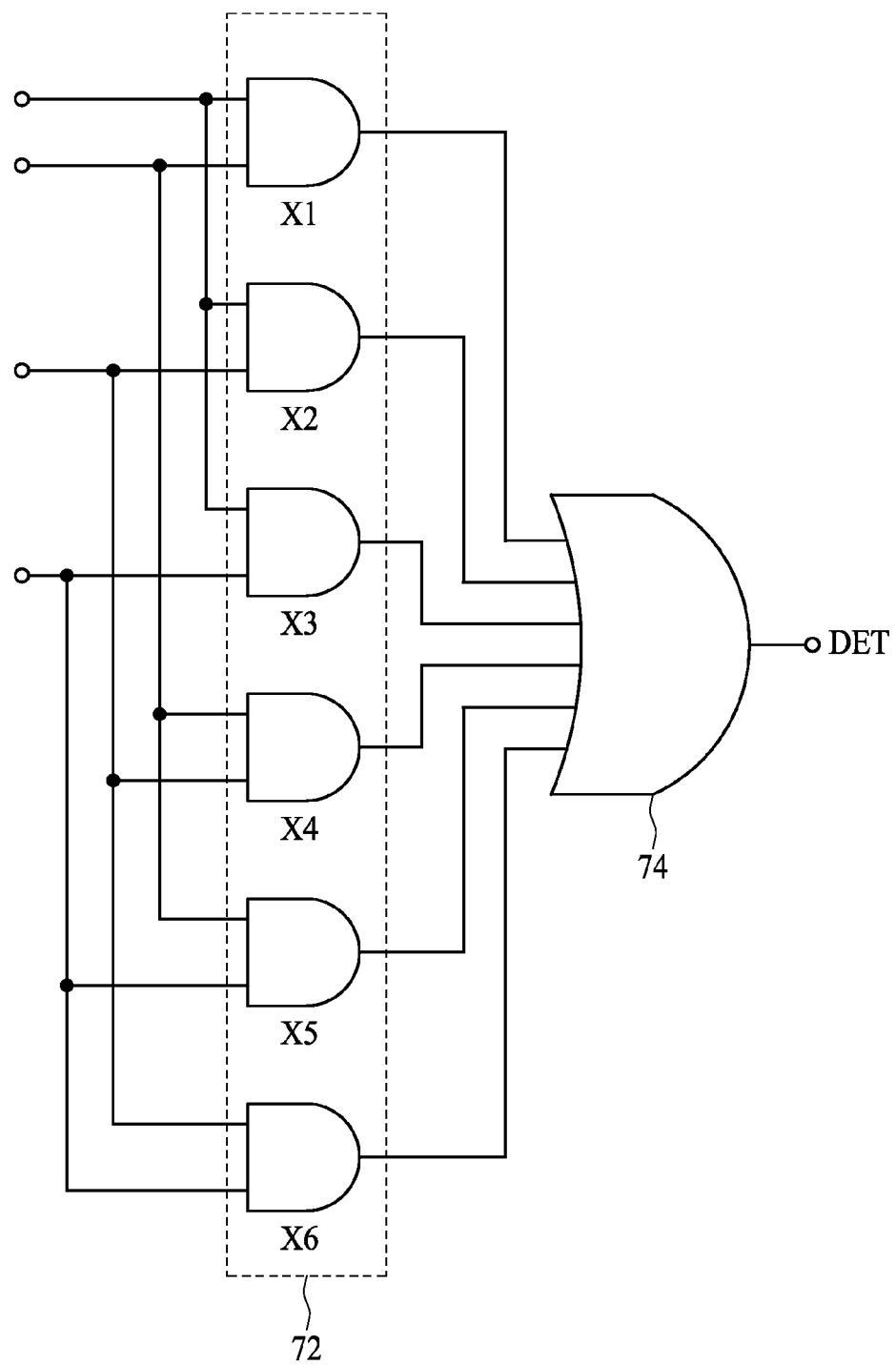
FIG. 7 is a schematic block diagram of a probability circuit according to an embodiment.

Each of the probability circuits 365-368 is used for determining whether more than two logic signals have level transitions. FIG. 7 is a schematic block diagram of the probability circuit according to an embodiment, which includes an AND array 72 and a multi-input OR circuit 74. Referring to FIG. 7, the AND array 72 is composed of a plurality of AND circuits X1-X6, for receiving output signals from the probability circuits 365-368, and generating a plurality of logic operation signals. The OR circuit 74 receives the logic operation signals, and performs an OR operation to generate corresponding detection signals.

In another embodiment, as shown in FIG. 3, a calibration unit 38, a state accumulation unit 40, and a data selection unit 42 need to be added to the level transition determination circuit 30, so as to determine the level transition points of the serial input data Din more correctly. Referring to FIG. 3, the calibration unit 38 receives the detection signals DET[1]-DET[N] from the state detection circuit, and generates calibration signals CAL[1]-CAL[N] through a logic operation. The state accumulation unit 40 receives the calibration signals CAL[1]-CAL[N] from the calibration unit, accumulates occurrence frequencies of the calibration signals CAL[1]-CAL[N], and outputs a state accumulation signal ACCUM which reflects the calibration signal having the highest occurrence frequency among the calibration signals CAL[1]-CAL[N]. The data selection unit 42 receives the serial input data Din, and selects a valid data bit in the serial input data Din according to the state accumulation signal ACCUM.

Referring to FIG. 5, in an embodiment, each bit period is sampled four times. It is possible that more than two of the sampled values are located at the bit edge of the input data Din, and therefore, the detection signals DET[1]-DET[4] may include two signals having high logic levels. In order to calibrate two detection signals having high logic levels to one high logic level, the calibration unit 38 is required to calibrate the signals.

Figure 8:
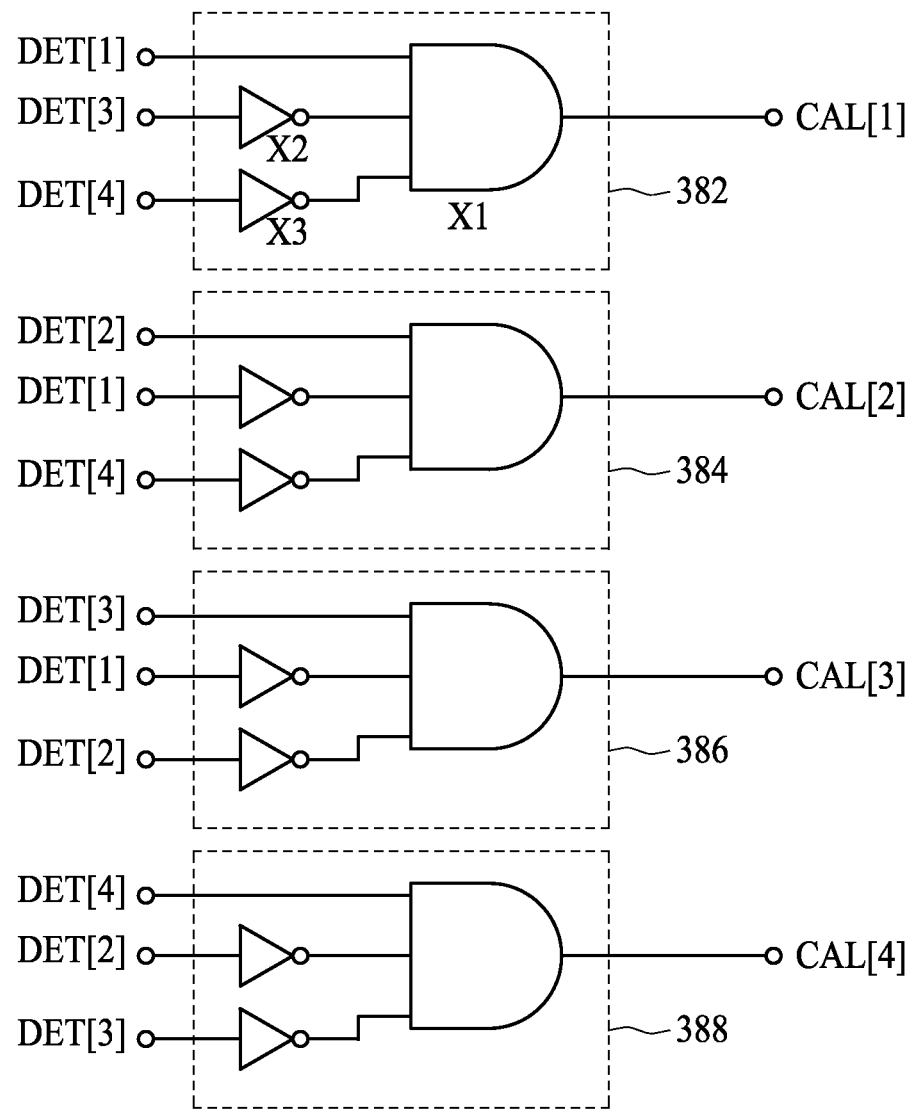
FIG. 8 is a schematic block diagram of a calibration unit according to an embodiment.

FIG. 8 is a schematic block diagram of the calibration unit 38 according to an embodiment, which includes a plurality of logic circuits 382-388. Referring to FIG. 8, the calibration unit 38 receives the detection signals DET[1]-DET[4], and generates calibration signal CAL[1]-CAL[4] according to logic levels of the detection signals DET[1]-DET[4]. By using the logic circuits 382-388, one of the calibration signal CAL[1]-CAL[4] has a logic level different from logic levels of other calibration signals.

Next, the calibration signals CAL[1]-CAL[4] are output to the state accumulation unit 40. The state accumulation unit 40 is designed to accumulate occurrence frequencies of the calibration signals CAL[1]-CAL[4]. If the occurrence frequency of one of the calibration signals CAL[1]-CAL[4] exceeds a preset threshold, the state accumulation unit 40 outputs a state accumulation signal ACCUM which reflects the calibration signal having the highest occurrence frequency among the calibration signals CAL[1]-CAL[4]. The calibration signal having the highest occurrence frequency represents that the sampled value operated therewith is located at the bit edge of the input data Din. Therefore, the data selection unit 42 selects a valid data bit position, which is far away from an edge position of the bit period, in the serial input data Din according to the state accumulation signal ACCUM.

Figure 9:
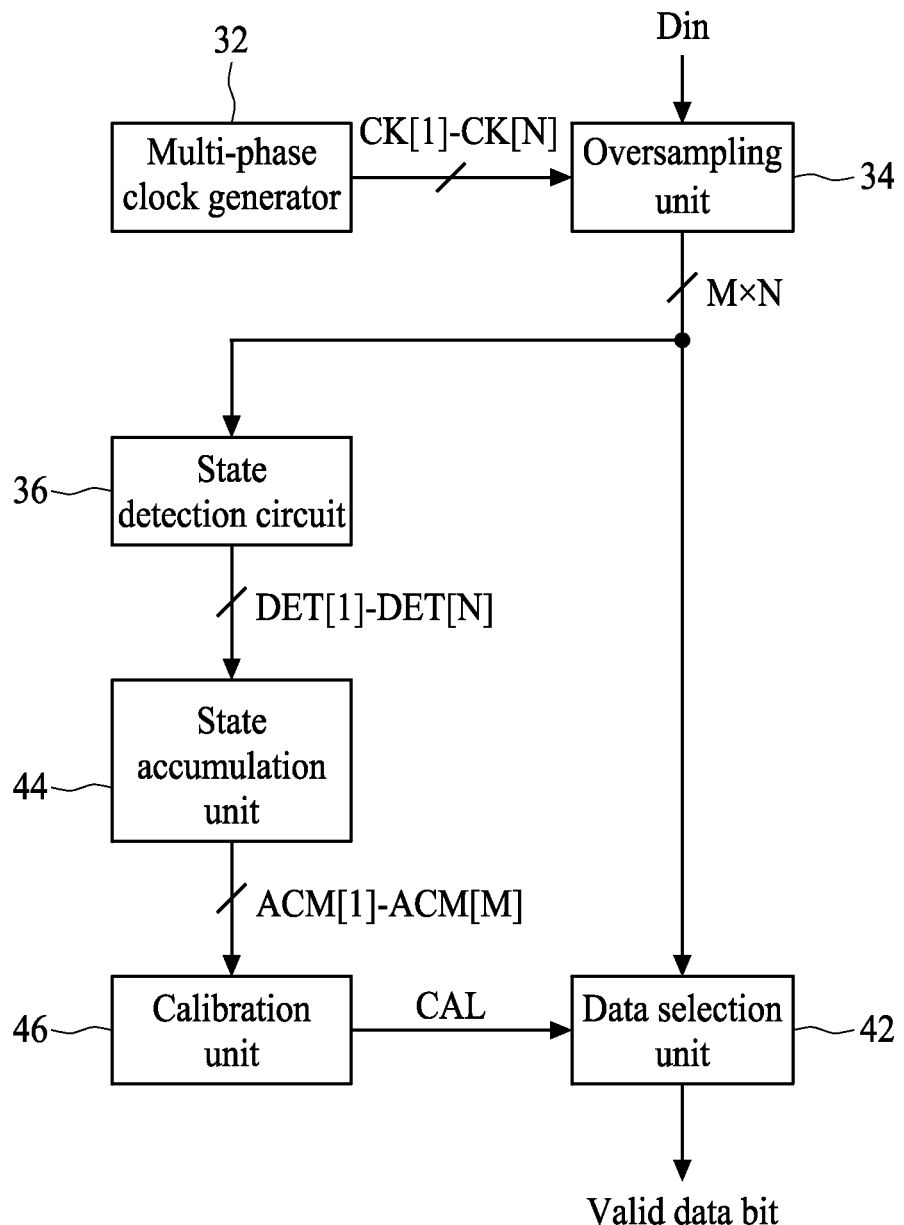
FIG. 9 is a schematic block diagram of a level transition determination circuit for serial input data according to another embodiment.

In another embodiment, as shown in FIG. 9, a state accumulation unit 44, a calibration unit 46, and a data selection unit 42 may be electrically connected to the state detection circuit 36, so as to determine the level transition points of the serial input data Din more correctly. Referring to FIG. 9, the state accumulation unit 44 receives the detection signals DET[1]-DET[N] from the state detection circuit, accumulates occurrence frequencies of the detection signals DET[1]-DET[N], and outputs at least one state accumulation signal ACM[1]-ACM[M] which reflects the detection signal having the highest occurrence frequency among the detection signals. The calibration unit 46 receives the state accumulation signals ACM[1]-ACM[M] from the state accumulation unit, and generates a calibration signal CAL through a logic operation. The data selection unit 42 receives the serial input data Din, and selects a valid data bit in the serial input data Din according to the calibration signal CAL.

The state accumulation unit 44 is designed to accumulate the occurrence frequencies of the detection signals DET[1]-DET[N] and output at least one state accumulation signal ACM[1]-ACM[M]. It is possible that more than two of the detection signals DET[1]-DET[N] have the highest occurrence frequency, and therefore, in order to calibrate a plurality of detection signals having the highest occurrence frequency to a final detection signal, so as to select the valid data bit position in the serial input data Din according to the final detection signal, the calibration unit 46 is required to calibrate output results of the state accumulation unit 44.

Figure 10:
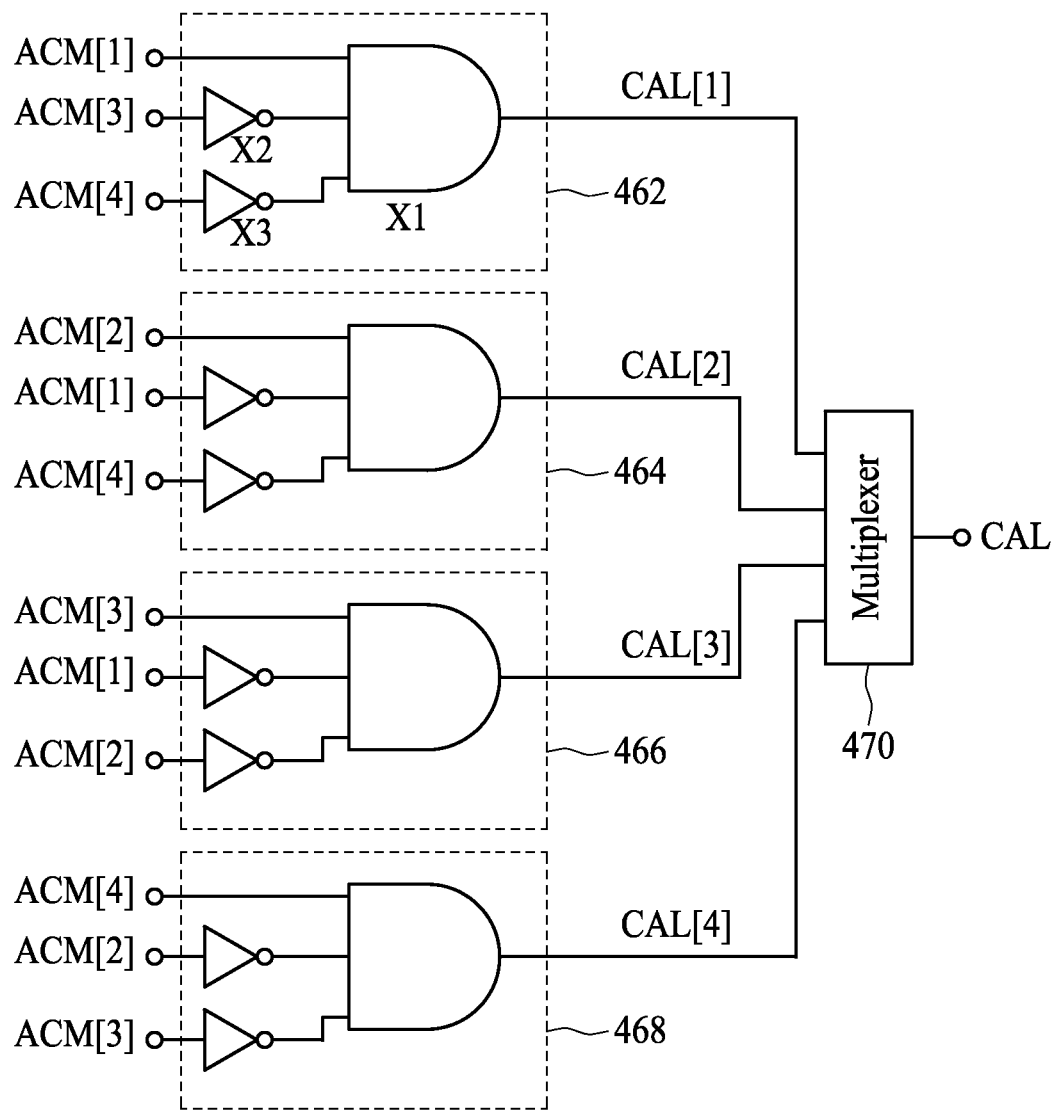
FIG. 10 is a schematic block diagram of the calibration unit according to an embodiment.

FIG. 10 is a schematic block diagram of the calibration unit 46 according to an embodiment, which includes a plurality of logic circuits 462-470. For simplicity, in FIG. 10, four state accumulation signals ACM[1]-ACM[4] are taken as an example. Referring to FIG. 10, the calibration unit 46 receives the state accumulation signals ACM[1]-ACM[4], and generates calibration signals CAL[1]-CAL[4] according to logic levels of the state accumulation signals ACM[1]-ACM[4]. By using the logic circuits 462-468, one of the calibration signals CAL[1]-CAL[4] has a logic level different from logic levels of other calibration signals. A multiplexer receives the calibration signals CAL[1]-CAL[4], and generates the calibration signal CAL which represents a calibration signal having the different logic level.

Next, the calibration signal CAL is output to the data selection unit 42. The data selection unit 42 selects a valid data bit, which is far away from the edge position of the bit period, in the serial input data Din according to the calibration signal CAL.

Technical content and technical features of the present invention are disclosed above, however, those skilled in the art can still make various replacements and modifications without departing from the spirit of the present invention based on the teaching and disclosure of the present invention. Therefore, the protection scope of the present invention is not limited to what is disclosed in the embodiments, but includes various replacements and modifications without departing from the present invention, and is covered by the claims in the following.

We claim:
1. A level transition determination circuit comprising:
   a multi-phase clock generator for receiving an input clock signal and generating S×N clock signals, wherein each clock signal is synchronized to the input clock signal and has a different delay time, and S and N are integers;

an oversampling unit for performing N-times oversampling on M bit periods of a serial input data according to the clock signals so as to generate M×N sampled values in parallel during the M bit periods; and a state detection circuit for receiving (M×N)+1 sampled values and for generating N detection signals by detecting level transitions between adjacent sampled values in the (M×N)+1 sampled values and the level transition results;

wherein the state detection circuit comprises:
M groups of logic circuits, wherein each group of logic circuits comprises N Exclusive-OR (XOR) circuits, and each XOR circuit is used for performing an XOR operation on adjacent sampled values in the serial input data; and N probability circuits each for receiving an output signal from a different group of logic circuits and for generating a detection signal according to M output signals, wherein the M output signals are spaced from each other by a fixed time interval;

wherein each of the probability circuits comprises:
an AND array for receiving the M output signals and for generating a plurality of logic operation signals; and
an OR circuit for receiving the logic operation signals and for generating the detection signal.

2. The level transition determination circuit according to claim 1, further comprising:
a calibration unit for receiving the N detection signals from the state detection circuit and for generating N calibration signals through a logic operation;
a state accumulation unit for receiving the N calibration signals from the calibration unit accumulating occurrence frequency of the calibration signals and for outputting a state accumulation signal, wherein the state accumulation signal reflects a calibration signal having a highest occurrence frequency among the calibration signals; and
a data selection unit for receiving the serial input data and for selecting a valid data bit in the serial input data according to the state accumulation signal.

3. The level transition determination circuit according to claim 2, wherein the calibration unit comprises:
N logic circuits for receiving the N detection signals and for generating N calibration signals according to logic levels of the N detection signals, wherein one of the N calibration signals has a logic level different from logic levels of other calibration signals.

4. The level transition determination circuit according to claim 1, wherein the state detection circuit receives the sampled values obtained by the oversampling unit according to current clock signals and a sampled value from a previous bit period.

5. The level transition determination circuit according to claim 1, wherein the oversampling unit comprises:
M×N sampling circuits each for receiving the serial input data and for sampling according to one of the clock signals and for outputting a sampled value of the serial input data.

6. The level transition determination circuit according to claim 1, wherein the level transition determination circuit is applied in a burst-mode receiver of a passive optical network (PON) for recovering data.

7. The level transition determination circuit according to claim 1, further comprising:
a state accumulation unit for receiving N detection signals from the state detection circuit and for accumulating occurrence frequencies of the N detection signals and for outputting at least one state accumulation signal, wherein the state accumulation signal reflects the detection signal having the highest occurrence frequency among the detection signals;
a calibration unit for receiving the at least one state accumulation signal from the state accumulation unit and for generating a calibration signal through a logic operation; and
a data selection unit for receiving the serial input data and for selecting a valid data bit in the serial input data according to the calibration signal.

8. The level transition determination circuit according to claim 7, wherein the calibration unit comprises:
at least one logic circuit for receiving the at least one state accumulation signal from the state accumulation unit and for generating a calibration signal according to a logic level of the at least one state accumulation signal, wherein the calibration signal has a logic level different from logic levels of other state accumulation signals.

9. A level transition determination method comprising:
receiving an input clock signal and generating S×N clock signals, wherein each clock signal is synchronized to the input clock signal and has a different delay time, and S and N are integers;
performing N-times oversampling on M bit periods of a serial input data according to the clock signals so as to generate M×N sampled values in parallel during the M bit periods; and
receiving (M×N)+1 sampled values and generating N detection signals by detecting level transitions between adjacent sampled values in the (M×N)+1 sampled values and the level transition results.

10. The level transition determination method according to claim 9, further comprising:
receiving the N detection signals and generating N calibration signals through a logic operation;
receiving the N calibration signals and accumulating occurrence frequencies of the calibration signals and outputting a state accumulation signal, wherein the state accumulating signal reflects a calibration signal having the highest occurrence frequency among the calibration signal; and
selecting a valid data bit in the serial input data according to the state accumulation signal.

11. The level transition determination method according to claim 10, wherein the step of generating the N calibration signals comprises:
receiving the N detection signals and generating N calibration signals according to logic levels of the N detection signals, wherein one of the N calibration signals has a logic level different from logic levels of other calibration signals.

12. The level transition determination method according to claim 9, further comprising:
receiving N detection signals from the state detection circuit;
accumulating occurrence frequencies of the N detection signals to output at least one state accumulation signal, wherein the state accumulation signal reflects a detection signal having the highest occurrence frequency among the detection signal;
receiving the at least one state accumulation signal, and generating a calibration signal through a logic operation; and
selecting a valid data bit in the serial input data according to the calibration signal.

13. The level transition determination method according to claim 9, wherein the step of generating the N detection signals comprises:
- performing an Exclusive-OR (XOR) operation on adjacent sampled values in the serial input data to generate M×N logic signals;
- dividing the M×N logic signals into M groups of signals; and
- generating a detection signal through operation according to logic signals each from a different group of signals, wherein the logic signals are spaced from each other by a fixed time interval.

14. The level transition determination method according to claim 9, wherein the serial input data is a burst serial input data.

\* \* \* \* \*